United States Patent
Yang et al.

(10) Patent No.: US 11,652,142 B2
(45) Date of Patent: May 16, 2023

(54) LATERAL BIPOLAR JUNCTION TRANSISTORS HAVING AN EMITTER EXTENSION AND A HALO REGION

(71) Applicant: GLOBALFOUNDRIES U.S. Inc., Malta, NY (US)

(72) Inventors: Mankyu Yang, Fishkill, NY (US); Richard Taylor, III, Campbell, CA (US); Alexander Derrickson, Saratoga Springs, NY (US); Alexander Martin, Greenfield Center, NY (US); Jagar Singh, Clifton Park, NY (US); Judson Robert Holt, Ballston Lake, NY (US); Haiting Wang, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/482,374

(22) Filed: Sep. 22, 2021

(65) Prior Publication Data

US 2023/0092435 A1     Mar. 23, 2023

(51) Int. Cl.
  *H01L 29/08*       (2006.01)
  *H01L 29/66*       (2006.01)
  (Continued)

(52) U.S. Cl.
  CPC ...... *H01L 29/0804* (2013.01); *H01L 29/0808* (2013.01); *H01L 29/0821* (2013.01);
  (Continued)

(58) Field of Classification Search
  CPC ............. H01L 29/0804; H01L 29/1008; H01L 29/6625; H01L 29/735
  See application file for complete search history.

(56) References Cited

U.S. PATENT DOCUMENTS

| 5,936,278 A | 8/1999 | Hu et al. |
| 9,059,195 B2 | 6/2015 | Cai et al. |

(Continued)

FOREIGN PATENT DOCUMENTS

EP     2394298 B1     3/2013

OTHER PUBLICATIONS

Neamen; Semiconductor Physics and Devices; 4th Edition; Mc Graw Hill; ISBN 978-0-07-352958-5; pp. 491-500 (Year: 2012).*

(Continued)

*Primary Examiner* — Syed I Gheyas
(74) *Attorney, Agent, or Firm* — David Cain

(57) ABSTRACT

A structure for a lateral bipolar junction transistor is provided. The structure comprising an emitter including a first concentration of a first dopant. A collector including a second concentration of the first dopant, the first concentration of the first dopant may be different from the second concentration of the first dopant. An intrinsic base may be laterally arranged between the emitter and the collector, and an extrinsic base region may be above the intrinsic base. An emitter extension may be arranged adjacent to the emitter, whereby the emitter extension laterally extends under a portion of the extrinsic base region. A halo region may be arranged adjacent to the emitter extension, whereby the halo region laterally extends under another portion of the extrinsic base region.

20 Claims, 6 Drawing Sheets

(51) Int. Cl.
H01L 29/735 (2006.01)
H01L 29/10 (2006.01)

(52) U.S. Cl.
CPC ...... *H01L 29/1008* (2013.01); *H01L 29/6625* (2013.01); *H01L 29/735* (2013.01)

(56) References Cited

U.S. PATENT DOCUMENTS

| | | | |
|---|---|---|---|
| 9,190,501 B2 | 11/2015 | Ito et al. | |
| 9,741,713 B1 | 8/2017 | Singh | |
| 10,483,368 B1* | 11/2019 | Hashemi | ........... H01L 21/26513 |
| 2001/0054746 A1* | 12/2001 | Yamada | .............. H01L 29/1008 |
| | | | 257/565 |

OTHER PUBLICATIONS

Pouya Hashemi et al., Demonstration of Symmetric Lateral NPN Transistors on SOI Featuring Epitaxially Grown Emitter/Collector Regions, Journal of the Electron Devices Society, Dec. 2017, pp. 537-542, vol. 6, IEEE.

Saurav Chakraborty et al., Impact of Halo Doping on the Subthreshold Performance of Deep-Submicrometer CMOS Devices and Circuits for Ultralow Power Analog/Mixed-Signal Applications, IEEE Transactions on Electron Devices, Feb. 2007, pp. 241-247, vol. 54—No. 2, IEEE.

* cited by examiner

LATERAL BIPOLAR JUNCTION TRANSISTORS HAVING AN EMITTER EXTENSION AND A HALO REGION

FIELD OF THE INVENTION

The disclosed embodiments relate generally to semiconductor devices, and more particularly, to bipolar junction transistors having an emitter extension and a halo region.

BACKGROUND

Semiconductor processing has evolved sophisticated operations for fabricating integrated circuits. An integrated circuit may include an interconnected array of active and passive elements, such as transistors, resistors, capacitors, and inductors. The elements may be integrated with or deposited on a substrate.

A bipolar junction transistor (BJT or bipolar transistor) is a type of transistor that relies on the contact of two differently doped semiconductors for its operation, an n-doped and a p-doped semiconductor forming a PN junction. The term bipolar refers to the fact that both electrons and holes are involved in the operation of a BJT. The term junction refers to the fact that PN junctions are involved in the operation of a BJT. BJTs may be used as amplifiers, switches, or in oscillators. BJTs may be found either as individual discrete components, or in large numbers as parts of integrated circuits. However, traditional bipolar junction transistors have a low voltage gain. Hence, there is a need to overcome the challenge mentioned above.

SUMMARY

In an aspect of the present disclosure, a structure for a lateral bipolar junction transistor is provided. The structure comprising an emitter including a first concentration of a first dopant and a collector including a second concentration of the first dopant. The first concentration of the first dopant may be different from the second concentration of the first dopant. An intrinsic base may be laterally arranged between the emitter and the collector, and an extrinsic base region may be above the intrinsic base.

In another aspect of the present disclosure, a structure for a lateral bipolar junction transistor is provided. The structure comprising an emitter including a first concentration of a first dopant. An emitter extension may be arranged adjacent to the emitter. A collector including a second concentration of the first dopant, the second concentration of the first dopant may be less than the first concentration of the first dopant. An intrinsic base may be laterally arranged between the emitter and the collector, and an extrinsic base region may be arranged above the intrinsic base and the emitter extension. The extrinsic base region may directly contact the emitter extension.

In yet another aspect of the present disclosure, a method of fabricating a structure for a lateral bipolar junction transistor may be provided. The method comprising forming an intrinsic base, an emitter, and a collector, whereby the intrinsic base may be laterally arranged between the emitter and the collector. The emitter may be doped to a first concentration of the first dopant. The collector may be doped to a second concentration of the first dopant, whereby the first concentration of the first dopant may be different from the second concentration of the first dopant. An extrinsic base region above the intrinsic base may be formed.

BRIEF DESCRIPTION OF THE DRAWINGS

The disclosed embodiments will be better understood from a reading of the following detailed description, taken in conjunction with the accompanying drawings.

Figure 1:
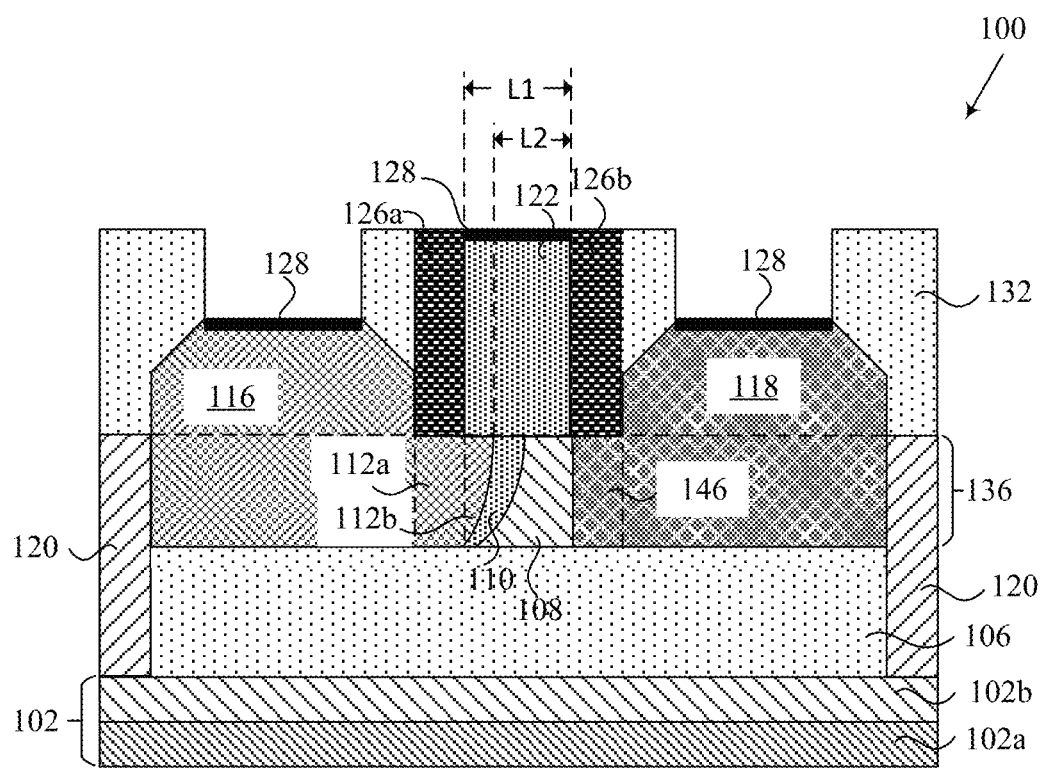
FIG. 1 illustrates a cross-sectional view of a semiconductor device, according to an embodiment of the disclosure.

For simplicity and clarity of illustration, the drawings illustrate the general manner of construction, and certain descriptions and details of features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1 illustrates a cross-sectional view of a semiconductor device 100, according to an embodiment of the disclosure. In one embodiment, the semiconductor device 100 may be a lateral bipolar junction transistor. The semiconductor device 100 may include a collector 118, an intrinsic base 108, an emitter 116, an extrinsic base region 122, an emitter extension 112, a collector extension 146, and a halo region 110. The emitter extension 112 may include two portions, 112a and 112b. A bottom oxide 106 may be arranged below the emitter 116, emitter extension 112, halo region 110, intrinsic base 108, collector extension 146 and collector 118. The intrinsic base 108 may be laterally arranged between the collector 118 and the emitter 116 and placed below the extrinsic base region 122. The emitter extension 112 may be placed next to the emitter 116 and below the extrinsic base region 122. The emitter extension 112 may be laterally arranged between the emitter 116 and the intrinsic base 108 and fully separates the emitter 116 from the intrinsic base 108. The portion 112a may fully separate the portion 112b from the emitter 116. The portion 112b may have a top surface interfacing the extrinsic base region 122 and a bottom surface interfacing the bottom oxide 106, and portion 112b may have a tapered profile. For example, portion 112b may have a top surface that is wider than its bottom surface. In another example, the bottom surface may be an edge. The emitter extension 112 may effectively narrow a width of the intrinsic base 108. The halo region 110 may be arranged between the emitter 116 and the collector 118, and below the extrinsic base region 122. The halo region 110 may be arranged next to the intrinsic base 108. In one embodiment, the halo region 110 may be arranged adjacent to the emitter extension 112 and laterally between the emitter 116 and the intrinsic base 108. The halo region 110 may fully separate the emitter extension 112 from the intrinsic base 108. The halo region 110 may have a top surface interfacing with the extrinsic base region 122 and a bottom surface interfacing the bottom oxide 106, and the top surface of the halo region 110 may be wider than the bottom surface. In an embodiment, the bottom surface may be an edge. The intrinsic base 108 may have a top surface interfacing with the extrinsic base region 122 and a bottom surface interfacing with the bottom oxide 106, and the bottom surface of the intrinsic base 108 is wider than the top surface. In an embodiment, the combined widths of the top surfaces of the halo region 110 and the intrinsic base 108 may be smaller than the combined widths of the bottom surfaces of the halo region 110 and the intrinsic base 108.

Spacer structures 126 may be arranged at side surfaces of the extrinsic base region 122. Spacer structures 126 may include spacer structure 126a arranged at a side surface of the extrinsic base region 122 and spacer structure 126b arranged at another side surface of the extrinsic base region 122 opposite to the spacer structure 126a. The spacer structures 126a and 126b may separate and electrically isolate the extrinsic base region 122 from the emitter 116 and the collector 118, respectively. The collector extension 146 may be arranged adjacent to the collector 118 and extends laterally underneath the spacer structure 126b. Portion 112a of the emitter extension 112 may be arranged underneath the spacer structure 126a and portion 112b of the emitter extension 112 may extend laterally underneath the extrinsic base 122. The shapes of the emitter extension 112 and the collector extension 146 may be asymmetrical.

In one embodiment, the collector 118, the collector extension 146, the emitter 116, and the emitter extension 112 may be n-doped. The emitter 116 may have a higher dopant concentration than the collector 118. For example, the dopant concentration of the emitter 116 may be in the range of $10^{20}$ to $4 \times 10^{20}$ cm$^{-3}$ while the collector 118 dopant concentration may be in the range of $10^{19}$ to $5 \times 10^{19}$ cm$^{-3}$. The collector extension 146 may have a similar dopant concentration as the collector 118. In one embodiment, the emitter extension portions 112a and 112b may have similar dopant concentrations. For example, portions 112a and 112b may have dopant concentrations like the emitter 116. Portions 112a and 112b may have dopant concentrations in the range of $10^{20}$ to $4 \times 10^{20}$ cm$^{-3}$. The highly doped emitter 116 and emitter extension 112 leads to a more efficient electron injection to the intrinsic base 108 during the device 100 operation. The electrons are transported to the lightly doped collector 118, which is partially depleted during the device 100 operation. In one embodiment, the base 108 and the halo region 110 may be p-doped. The halo region 110 may have a higher dopant concentration than the base 108. For example, the halo region 110 may have a dopant concentration in the range of $10^{20}$ to $5 \times 10^{20}$ cm$^{-3}$ while the intrinsic base 108 may have a dopant concentration in the range of $10^{18}$ to $3 \times 10^{18}$ cm$^{-3}$. The halo region 110 prevents punch through between depletion regions formed at the junction between the intrinsic base 108 and the emitter 116 and the junction between the intrinsic base 108 and the collector 118.

The extrinsic base region 122 may be p-doped and may have a higher dopant concentration than the intrinsic base 108. For example, the extrinsic base region 122 may have a dopant concentration in the range of $10^{20}$ to $5 \times 10^{20}$ cm$^{-3}$. The extrinsic base region 122 may have a dopant concentration range similar to the halo region 110. The extrinsic base region 122 serves as a low resistance node to access and bias the intrinsic base 108 and may have a bottom surface directly contacting the top surfaces of the intrinsic base 108, the halo region 110, and the emitter extension 112. The extrinsic base region 122 has a length L1 taken from a side surface in direct contact with the spacer structure 126a to the side surface in direct contact with the spacer structure 126b. A length L2 corresponding to the combined widths of the top surfaces of the p-doped intrinsic base 108 and the halo region 110 interfacing with the bottom surface of the extrinsic base region 122 may be shorter than the length L1 of the extrinsic base region 122, providing a high current and voltage gain for the device 100. The length L2 may be in the range of 9 nm to 17 nm. The length L1 may be in the range of 12 nm to 20 nm. The emitter extension 112 may at least be partially arranged below the extrinsic base region 122, thereby reducing the length L2 relative to L1 as the length of the p-doped intrinsic base 108 under the extrinsic base region 122 is reduced.

In an alternative embodiment, the emitter 116 and collector 118 may contain a p-type dopant, and the intrinsic base 108 and the extrinsic base 122 may contain an n-type dopant. In this instance, the emitter extension 112 and the collector extension 146 may also contain a p-type dopant and the halo region 110 may contain an n-type dopant.

The intrinsic base 108, the halo region 110, a portion of the emitter 116, the emitter extension 112, the collector extension 146, and a portion of the collector 118 may be arranged in an active layer 136. The active layer 136 may be arranged above the bottom oxide 106 and a substrate 102. A top surface of the active layer 136 may be illustrated by a dashed line. The substrate 102 may include a p-well 102b above a base substrate layer 102a. Shallow trench isolation (STI) structures 120 may be arranged adjacent the emitter 116 and the collector 118. Silicide layers 128 may be arranged at a top surface of the emitter 116, extrinsic base region 122 and collector 118. An interlayer dielectric (ILD) layer 132 may be arranged adjacent the emitter 116, collector 118, and spacer structures 126 and above the shallow trench isolation (STI) structures 120.

A possible operating condition for the device 100 is described in the subsequent paragraph. A bias of approximately 1V may be applied to the intrinsic base 108 through the extrinsic base region 122 while 3V may be applied to the collector 118. The emitter 116 may be grounded. The junction between the intrinsic base 108 and the emitter 116 is forward-biased and electrons are injected from the heavily doped emitter 116 to the lightly doped intrinsic base 108. The electrons diffuse across the intrinsic base 108 to the reverse-biased junction between the intrinsic base 108 and the collector 118 and get swept into the collector 118, producing a collector current, $I_C$. The lightly doped collector 118 may be partially depleted during the device 100 operation. The collector current, $I_C$, depends on the bias applied to the base 108 and emitter 116, $V_{BE}$, and is independent of the bias applied to the collector 118 and the emitter 116, $V_{CE}$, thereby enabling better control of the device 100.

Figure 2:
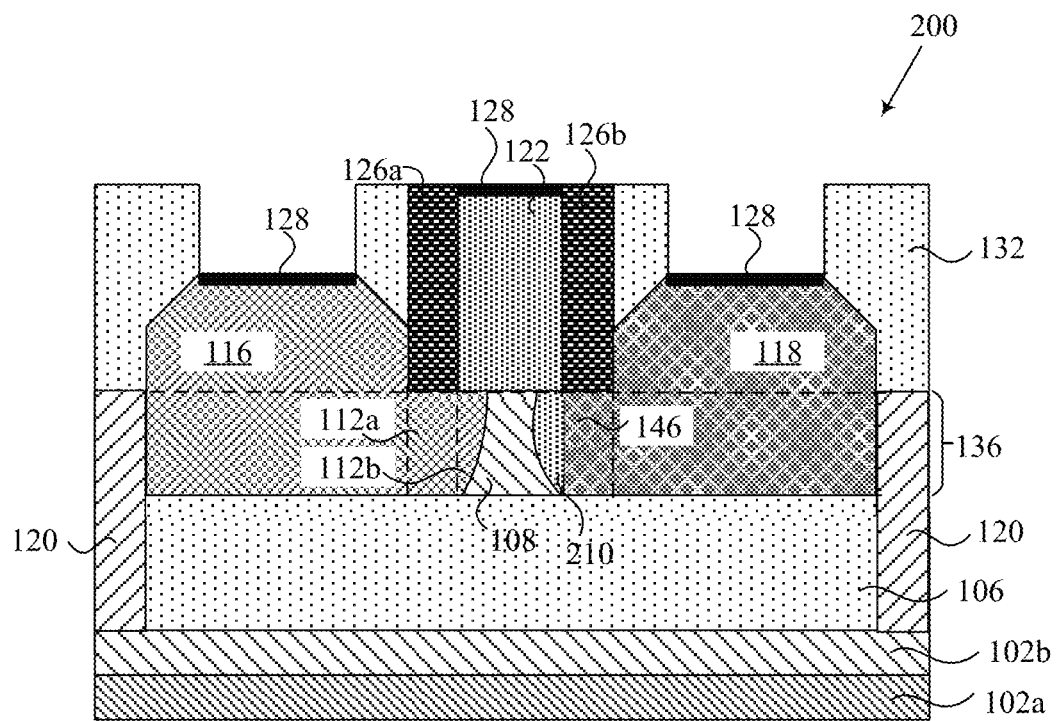
FIG. 2 illustrates a cross-sectional view of a semiconductor device, according to another embodiment of the disclosure.

The embodiment illustrated in FIG. 1 may be modified to form alternative embodiments within the scope of the disclosure. For example, FIG. 2 illustrates a cross-sectional view of a semiconductor device 200, according to another embodiment of the disclosure. Like numerals in FIG. 1 refer to like features in FIG. 2. In contrast to the semiconductor device 100, the semiconductor device 200 includes a halo region 210 adjacent to the collector 118 and the collector extension 146. The halo region 210 may be p-doped, arranged next to the intrinsic base 108 and placed below the extrinsic base region 122. The halo region 210 may fully separate the collector extension 146 from the intrinsic base 108. The halo region 210 may have a top surface interfacing with the extrinsic base region 122 and a bottom surface interfacing with a bottom oxide 106, and the top surface of the halo region 210 may be wider than the bottom surface. In an embodiment, the bottom surface may be an edge. The halo region 210 may have a similar dopant concentration as the halo region 110 shown in FIG. 1, preventing punch through of a depletion region formed at the junction between the intrinsic base 108 and the emitter 116 and the junction between the intrinsic base 108 and the collector 118. The intrinsic base 108 may have a top surface interfacing with the extrinsic base region 122 and a bottom surface interfacing with the bottom oxide 106, and the bottom surface of the intrinsic base 108 may be wider than the top surface. In an embodiment, the combined widths of the top surfaces of the halo region 210 and the intrinsic base 108 may be smaller than the combined widths of the bottom surfaces of the halo region 210 and the intrinsic base 108. An emitter extension 112 may be arranged below the extrinsic base region 122. The highly doped emitter extension 112 may contact the lightly doped intrinsic base 108, providing a more efficient electron injection during device 200 operation.

Figure 3:
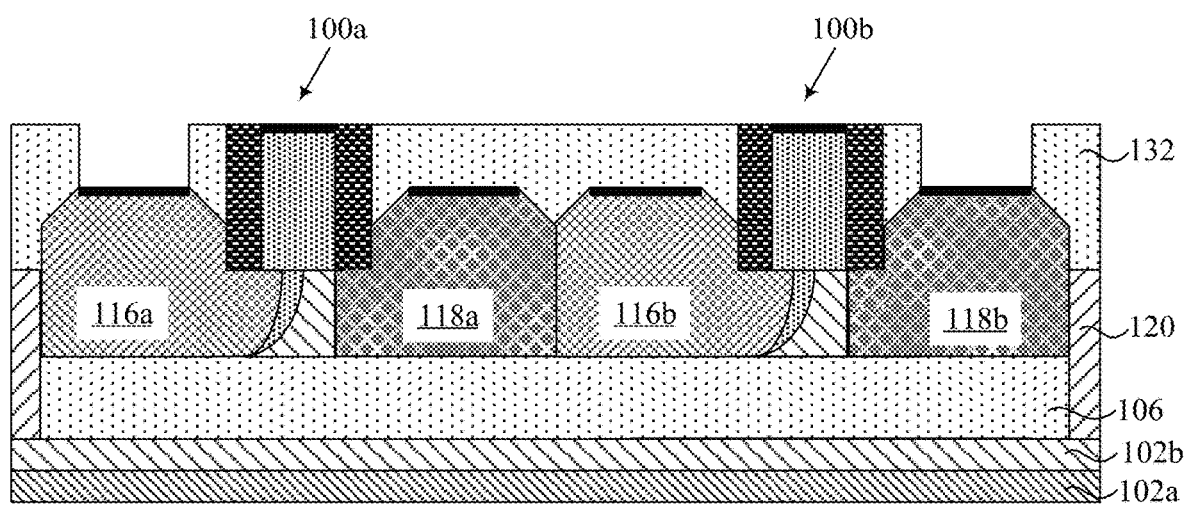
FIG. 3 illustrates a cross-sectional view of a cascode arrangement of the semiconductor device shown in FIG. 1, according to an embodiment of the disclosure.

FIG. 3 illustrates a cross-sectional view of a cascode arrangement of the semiconductor device 100 shown in FIG. 1, according to an embodiment of the disclosure. In a cascode arrangement, an emitter of a bipolar junction transistor may be electrically connected to a collector of a neighboring bipolar junction transistor. Referring to FIG. 3, two semiconductor devices, 100a and 100b, may be arranged adjacent to each other. A collector 118a of the device 100a may be arranged adjacent to an emitter 116b of the device 100b. The collector 118a may contact the emitter 116b, thereby forming an electrical connection and simplify emitter-collector connectivity in the cascode arrangement.

Figure 4A:
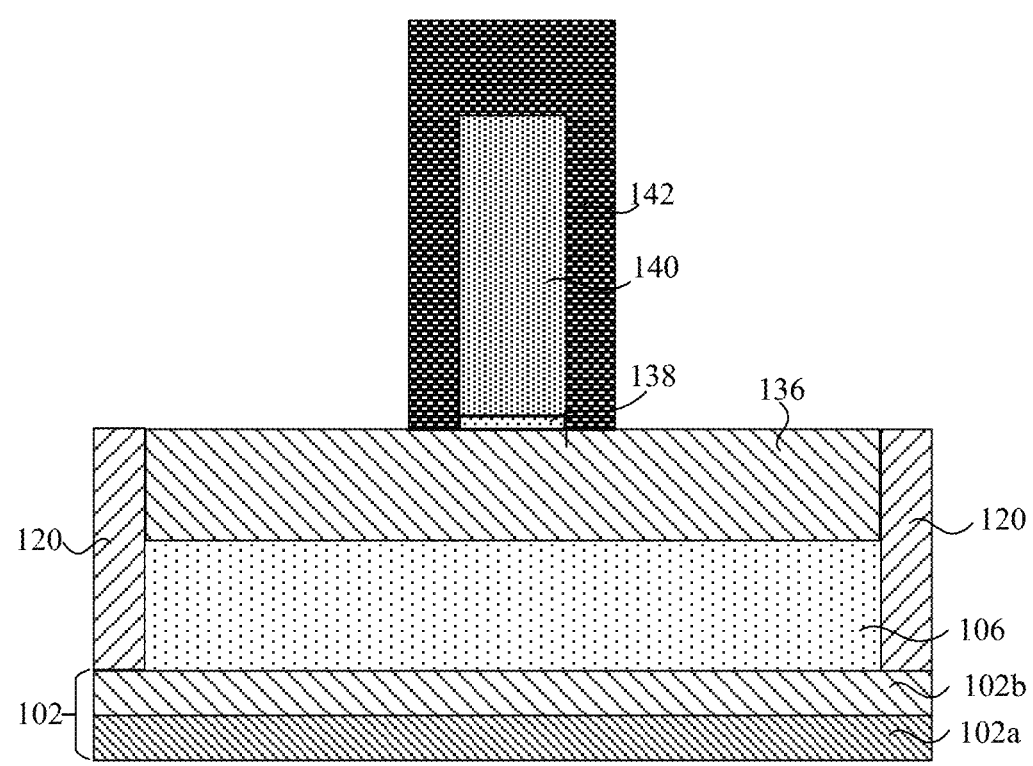
FIGS. 4A to 4F illustrate a fabrication process flow for the semiconductor device shown in FIG. 1, according to some embodiments of the disclosure.

FIGS. 4A to 4F illustrate a fabrication process flow for the semiconductor device 100 shown in FIG. 1, according to some embodiments of the disclosure. FIG. 4A illustrates a cross-sectional view of a partially-completed semiconductor device 100 having a substrate 102, a bottom oxide 106, an active layer 136, shallow trench isolation (STI) structures 120, a gate dielectric 138, a dummy gate 140, and a dielectric spacer layer 142, according to an embodiment of the disclosure. Referring to FIG. 4A, a silicon-on-insulator (SOI) substrate may be provided. The silicon-on-insulator (SOI) substrate may include the silicon substrate 102, the bottom oxide 106 above the substrate 102, and the active layer 136. The bottom oxide 106 may be made of silicon dioxide. The active layer 136 may be made of silicon and may have a thickness in the range of 5 to 10 nm. The shallow trench isolation structures 120 may be formed in the bottom oxide 106 and the active layer 136. Although not shown, from a top-down perspective, the shallow trench isolation structures 120 may be arranged surrounding a perimeter of the active layer 136, defining an area of the active layer 136. The active layer 136 and an upper portion of the silicon substrate 102 may be doped p-type with a suitable p-type dopant, for example, boron and boron fluoride. The p-doped upper portion of the silicon substrate 102 may form a p-well 102b. An undoped lower portion of the silicon substrate 102 below the p-well 102b may form the base substrate layer 102a. A layer of a suitable dielectric material, for example, silicon dioxide, may be deposited over the active layer 136.

A layer of polysilicon may be deposited over the silicon dioxide. The polysilicon layer and the silicon dioxide layer may be patterned by a photolithography process. In the photolithography process, a layer of photoresist may be deposited over the polysilicon layer and the silicon dioxide layer. The photoresist layer may be exposed and developed to form a suitable photoresist pattern. A wet etch or dry etch process may be used to remove portions of the polysilicon and silicon dioxide not covered by the photoresist pattern to form the dummy gate 140 and gate dielectric 138, respectively. The photoresist pattern may subsequently be removed. The dummy gate 140 may be arranged above the gate dielectric 138. A layer of a suitable dielectric material, for example, silicon nitride, may be conformally or uniformly deposited over the dummy gate 140 and subsequently etched by an anisotropic etching process to form the dielectric spacer layer 142 over side surfaces and a top surface of the dummy gate 140. The term "anisotropic etch" may refer to an etching process that is directional in nature.

Figure 4B:
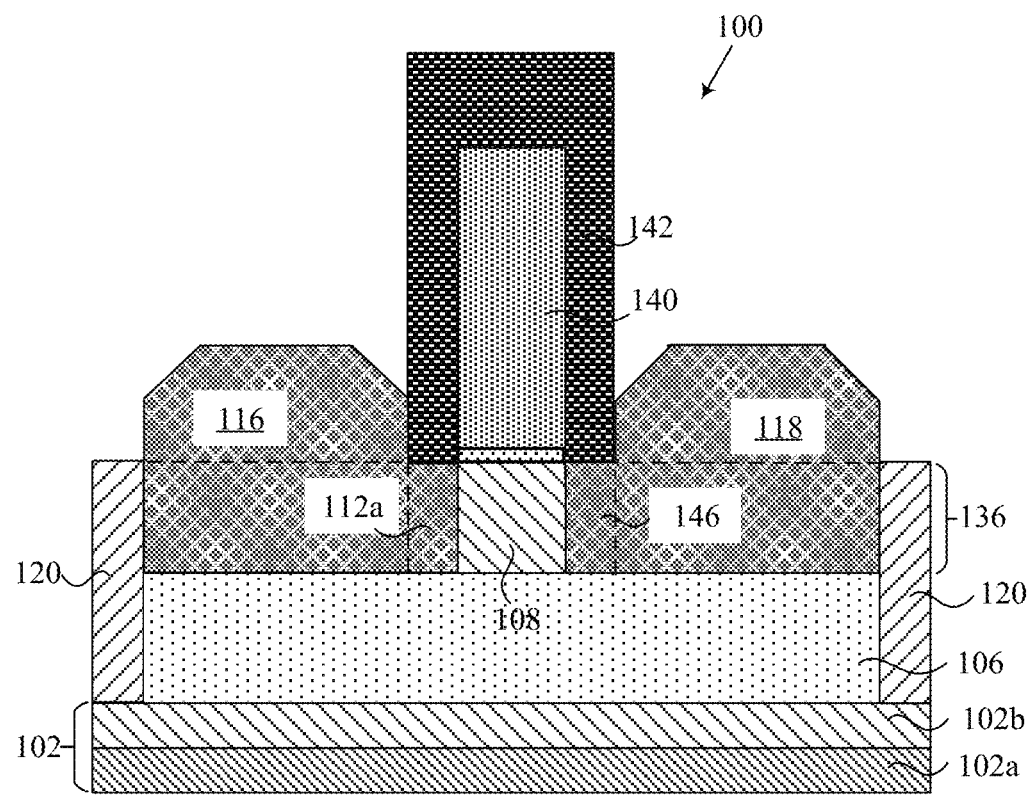

FIG. 4B illustrates a cross-sectional view of a partially completed semiconductor device 100 after formation of an emitter 116, an emitter extension 112a, an intrinsic base 108, a collector 118, and a collector extension 146, according to an embodiment of the disclosure. The upper portions of the emitter 116 and the collector 118 may be formed by epitaxial growth of a suitable semiconductor, for example, silicon. The emitter 116 and the collector 118 may be doped n-type with a suitable n-type dopant, for example, arsenic, phosphorus, or antimony (Sb). Lower portions of the emitter 116 and the collector 118 may be formed in the active layer 136. Upper portions of the emitter 116 and the collector 118 may protrude upwards above a top surface of the active layer 136. The top surface of the active layer 136 is indicated by a dashed outline. The emitter extension 112a and the collector extension 146 may be formed in the active layer 136 below the dielectric spacer layer 142 during the doping process due to lateral diffusion of dopants from the emitter 116 and the collector 118, respectively, to below the spacer layer 142. The emitter extension 112a and the collector extension 146 may be made of the same material as the active layer 136. The dielectric spacer layer 142 may separate the emitter 116 and the collector 118 from the dummy gate 140. A portion of the active layer 136 below the dummy gate 140 between the emitter 116 and the collector 118 forms the intrinsic base 108. The dummy gate 140 may define a width of the intrinsic base 108.

Figure 4C:
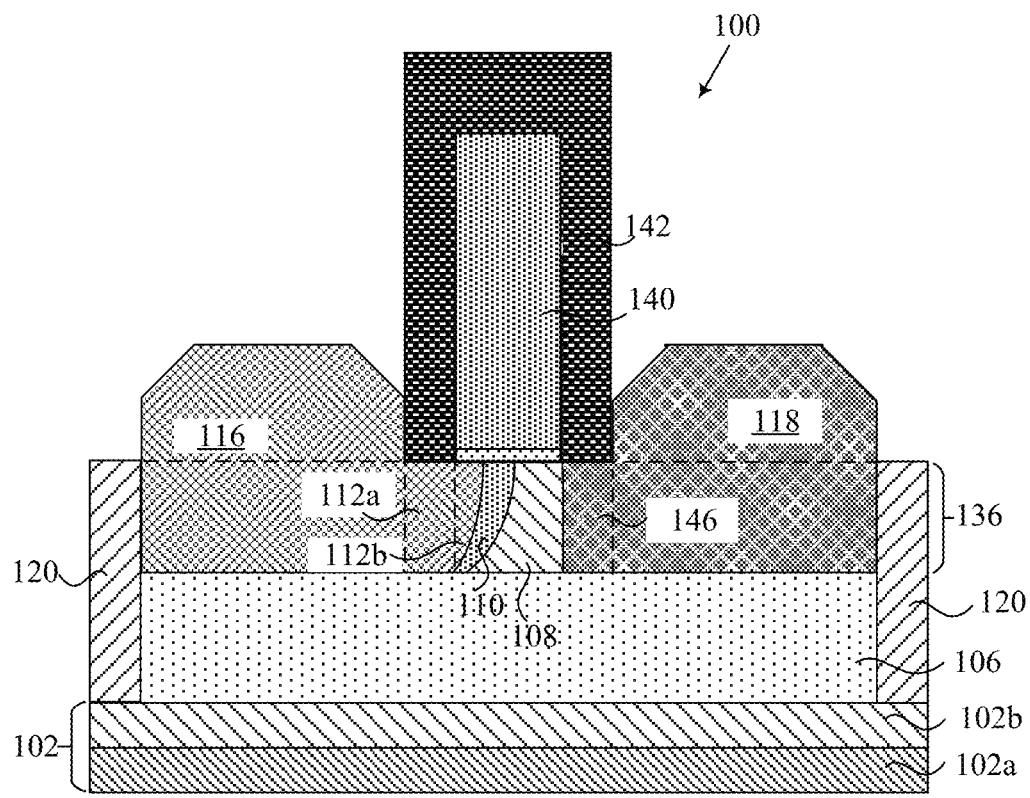

FIG. 4C illustrates a cross-sectional view of a partially completed semiconductor device 100 after further doping the emitter 116, formation of emitter extension portions 112a and 112b, and a halo region 110, according to an embodiment of the disclosure. The halo region 110 may be formed next to the intrinsic base 108 and under the dummy gate 140. The formation of the halo region 110 may include doping with a suitable p-type dopant, for example, boron and boron fluoride. An emitter extension 112 having two portions 112a and 112b may be formed in the active layer 136 between the emitter 116 and the halo region 110. The emitter extension portion 112a may be formed underneath the spacer layer 142 while the emitter extension portion 112b may be formed underneath a portion of the dummy gate 140. The emitter extension 112 may be formed adjacent to the emitter 116 and the halo region 110. The formation of the emitter extension 112 may include doping with a suitable n-type dopant, for example, arsenic (As), phosphorus (P), or antimony (Sb). The doping process may result in similar doping concentrations for the emitter extension portions 112a and 112b. The doping process to form the emitter extension 112 may also simultaneously further dope the emitter 116, increasing the dopant concentration of the emitter 116 compared to the collector 118.

Figure 4D:
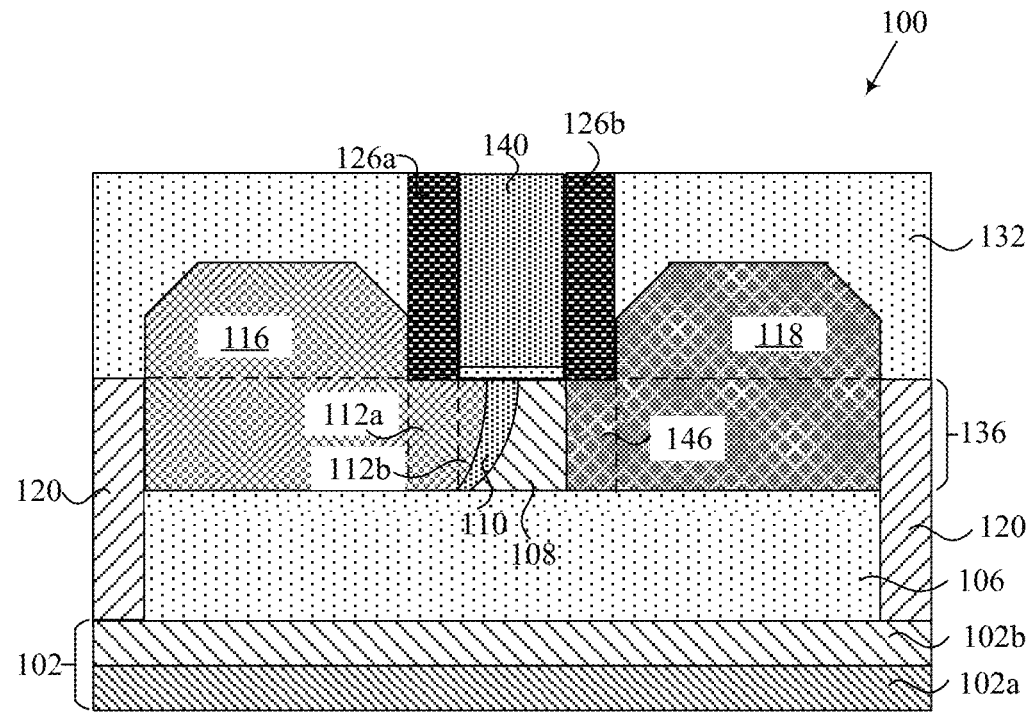

FIG. 4D illustrates a cross-sectional view of a partially completed semiconductor device 100 after deposition of an interlayer dielectric layer 132 and formation of spacer structures 126, according to an embodiment of the disclosure. The spacer structures 126 may include spacer structures 126a and 126b. The interlayer dielectric layer 132 may be deposited over the shallow trench isolation structures 120, the emitter 116, the dielectric spacer layer 142 and the collector 118. A suitable planarization process, for example, chemical mechanical planarization (CMP), may be used to remove an upper portion of the interlayer dielectric layer 132, the dielectric spacer layer 142, and the dummy gate 140. The process may leave behind lower portions of the dielectric spacer layer 142 over side surfaces of a lower portion of the dummy gate 140, thereby forming the spacer structures 126a and 126b adjacent to the side surfaces of the dummy gate 140. A top surface of the dummy gate 140 may be exposed by the planarization process. The process also leaves behind lower portions of the interlayer dielectric layer 132 at side surfaces of the spacer structures 126 and over top surfaces of the emitter 116, the collector 118 and the shallow trench isolation structures 120.

Figure 4E:
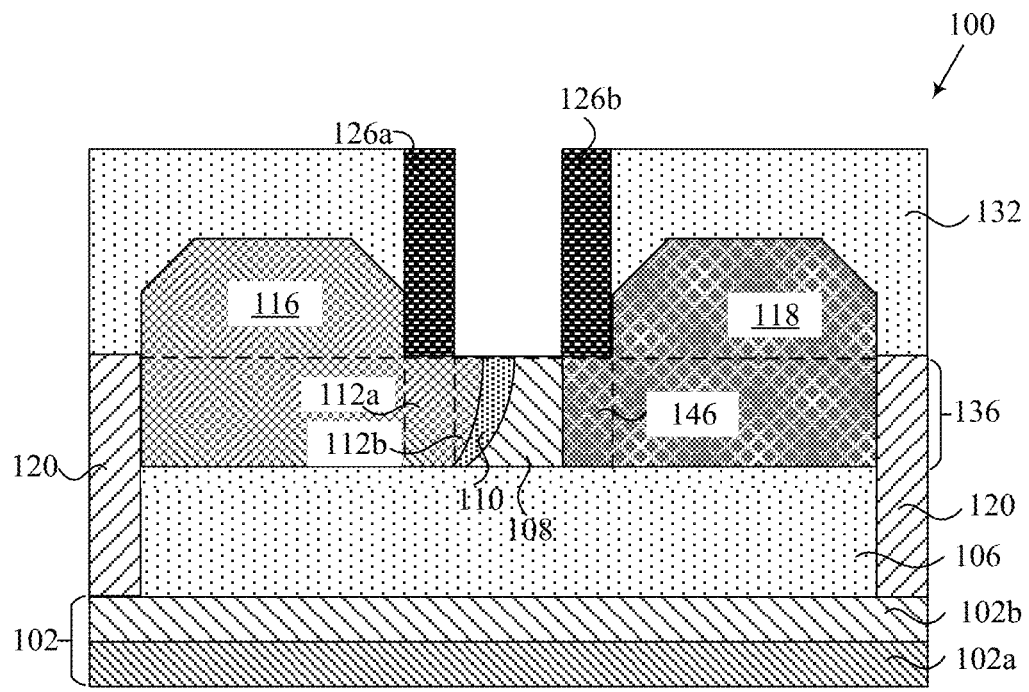

FIG. 4E illustrates a cross-sectional view of a partially completed semiconductor device 100 after removal of the gate dielectric 138 and the dummy gate 140, according to an embodiment of the disclosure. The dummy gate 140 and the gate dielectric 138 may be removed by a wet etch or dry etch process, leaving behind an opening between the spacer structures 126. Top surfaces of the emitter extension portion 112b, the halo region 110 and the intrinsic base 108 may be exposed after the removal process.

Figure 4F:
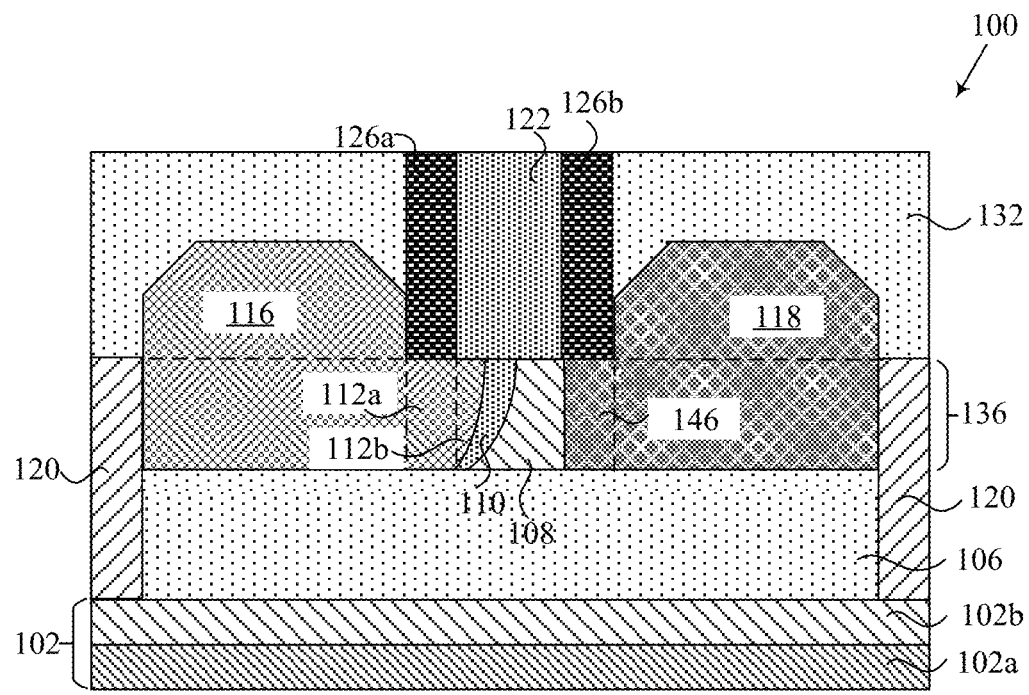

FIG. 4F illustrates a cross-sectional view of a partially completed semiconductor device 100 after formation of an extrinsic base region 122, according to an embodiment of the disclosure. The extrinsic base region 122 may be formed on the top surfaces of the emitter extension portion 112b, the halo region 110 and the intrinsic base 108, and between the spacer structures 126. The formation of the extrinsic base region 122 may include epitaxial growth of p-doped polysilicon.

The fabrication process may continue to form the semiconductor device 100 illustrated in FIG. 1. Referring to FIG. 1, openings may be formed in the interlayer dielectric layer 132 to expose top surfaces of the emitter 116 and the collector 118. The formation of the openings may include patterning using a photolithography process followed by a wet etch or dry etch process. Silicide layers 128 may be formed over the top surfaces of the emitter 116, the collector 118 and the extrinsic base region 122 to provide low contact resistance.

Figure 5:
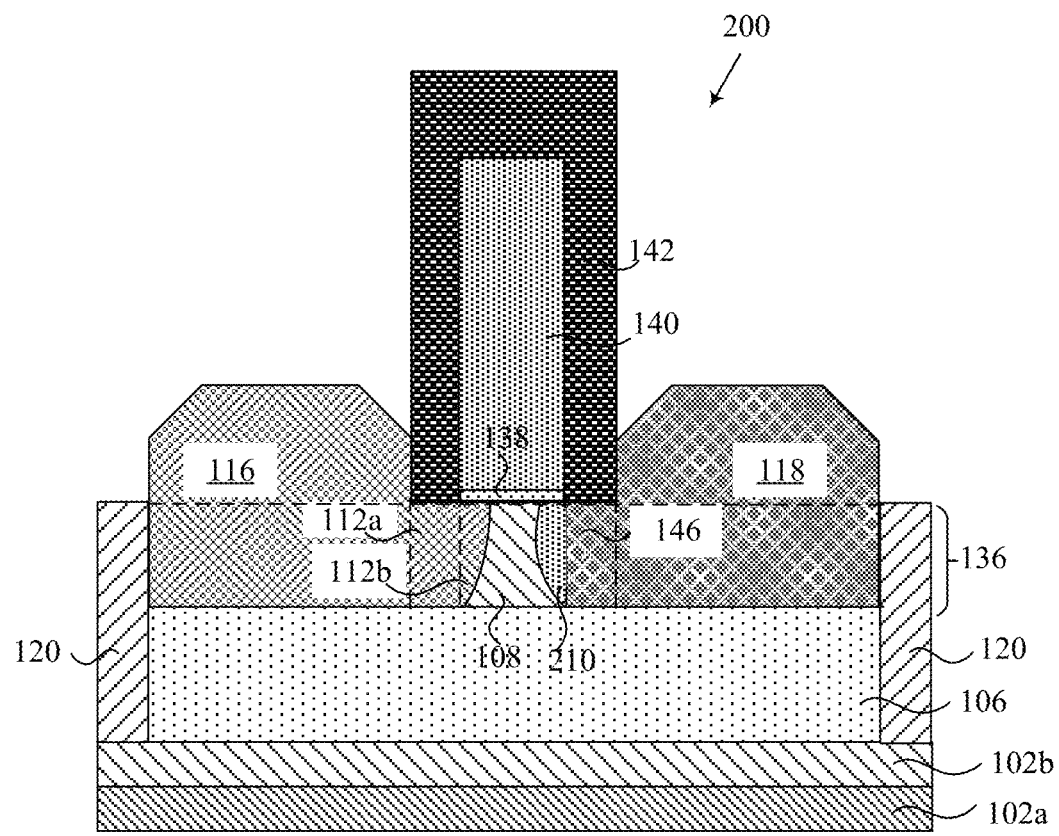
FIG. 5 illustrates a fabrication process for the semiconductor device shown in FIG. 2, according to some embodiments of the disclosure.

The fabrication process of the semiconductor device 200 is like the fabrication process of the semiconductor device 100 except for the formation of the halo region 210 between the intrinsic base 108 and the collector extension 146. For example, the formation of the shallow trench isolation (STI) structures 120, the gate dielectric 138, the dummy gate 140, the dielectric spacer layer 142, and the p-well 102b may be like the fabrication process outlined in FIG. 4A. The formation of the emitter 116, the emitter extension 112a, the intrinsic base 108, the collector 118, and the collector extension 146 may be like the fabrication process of like features outlined in FIG. 4B. FIG. 5 shows a partially completed semiconductor device 200 after doping the emitter 116, formation of an emitter extension 112, and a halo region 210, according to an embodiment of the disclosure. The formation of the emitter extension 112 and the doping of the emitter 116 may be like the process outlined in FIG. 4C. The halo region 210 may be formed next to the intrinsic base 108, adjacent to the collector extension 146, and under the dummy gate 140. The formation of the halo region 210 may include doping with a suitable p-type dopant, for example, boron and boron fluoride. Thereafter, the formation of the spacer structures 126, and the interlayer dielectric layer 132 may be like the process outlined in FIG. 4D. The removal of the dummy gate 140 and the formation of the extrinsic base region 122 may follow the process outlined in FIGS. 4E and 4F, respectively.

The fabrication process may continue to form the semiconductor device 200 illustrated in FIG. 2. Referring to FIG. 2, openings may be formed in the interlayer dielectric layer 132 to expose top surfaces of the emitter 116 and the collector 118. Silicide layers may be formed at the top surfaces of the emitter 116, the collector 118 and at a top surface of the extrinsic base region 122.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A structure for a lateral bipolar junction transistor, the structure comprising:

an emitter including a first concentration of a first dopant;

a collector including a second concentration of the first dopant, the first concentration of the first dopant is different from the second concentration of the first dopant;

an intrinsic base and a halo region laterally arranged between the emitter and the collector, wherein the intrinsic base and the halo region comprise a second dopant of opposite conductivity type to the first dopant, and the halo region has a higher dopant concentration of the second dopant than the intrinsic base; and an extrinsic base region above the intrinsic base and the halo region.

2. The structure of claim 1, further comprising:
an emitter extension and a collector extension, wherein the emitter extension and the collector extension are asymmetrical, and the emitter extension includes a portion that laterally extends under the extrinsic base region.

3. The structure of claim 2, wherein the emitter extension is doped with the first dopant and the emitter extension has a similar dopant concentration as the emitter.

4. The structure of claim 2, wherein the emitter extension is laterally positioned between the emitter and the intrinsic base.

5. The structure of claim 2, wherein the emitter extension fully separates the emitter from the intrinsic base.

6. The structure of claim 2, further comprising:
a bottom oxide under the emitter, the emitter extension and the intrinsic base, and the portion of the emitter extension under the extrinsic base region has a top surface and a bottom surface, wherein the top surface interfaces with the extrinsic base region, and the bottom surface interfaces with the bottom oxide.

7. The structure of claim 2, wherein the halo region is arranged between the intrinsic base and the emitter extension.

8. The structure of claim 7, wherein the halo region fully separates the emitter extension from the intrinsic base.

9. The structure of claim 7, further comprising:
a bottom oxide below the emitter extension, the intrinsic base, and the halo region, and the halo region has a top surface and a bottom surface, wherein the top surface interfaces with the extrinsic base region and the bottom surface interfaces with the bottom oxide.

10. The structure of claim 2, wherein the halo region is arranged between the intrinsic base and the collector extension.

11. The structure of claim 10, wherein the halo region fully separates the collector extension from the intrinsic base.

12. The structure of claim 10, further comprising:
a bottom oxide under the collector extension, the intrinsic base and the halo region, and the halo region has a top surface and a bottom surface, wherein the top surface interfaces with the extrinsic base region and the bottom surface interfaces with the bottom oxide.

13. The structure of claim 1, wherein the extrinsic base region directly contacts the intrinsic base.

14. The structure of claim 1, wherein the first dopant is an n-type dopant.

15. A structure for a lateral bipolar junction transistor, the structure comprising:

an emitter including a first concentration of a first dopant;
an emitter extension adjacent to the emitter;
a collector including a second concentration of the first dopant, the second concentration of the first dopant is less than the first concentration of the first dopant;
an intrinsic base and a halo region laterally arranged between the emitter and the collector, wherein the intrinsic base and the halo region comprise a second dopant of opposite conductivity type to the first dopant, and the halo region has a higher dopant concentration of the second dopant than the intrinsic base; and
an extrinsic base region above the intrinsic base, the halo region and the emitter extension, wherein the extrinsic base region directly contacts the emitter extension.

16. The structure of claim 15, further comprising:
a collector extension;
a first spacer structure at a first side surface of the extrinsic base region and a second spacer structure at a second side surface of the extrinsic base region opposite to the first side surface; and
the collector extension extends laterally underneath the first spacer structure.

17. The structure of claim 16, wherein the emitter extension has a first portion and a second portion, the first portion is arranged underneath the second spacer structure, and the second portion extends laterally underneath the extrinsic base region.

18. A method of fabricating a structure for a lateral bipolar junction transistor comprising:
forming an intrinsic base, a halo region, an emitter and a collector, wherein the intrinsic base and the halo region are laterally arranged between the emitter and the collector;
doping the emitter to a first concentration of a first dopant;
doping the collector to a second concentration of the first dopant, wherein the first concentration of the first dopant is different from the second concentration of the first dopant; and
forming an extrinsic base region above the intrinsic base and the halo region;
wherein the intrinsic base and the halo region comprise a second dopant of opposite conductivity type to the first dopant, and the halo region has a higher dopant concentration of the second dopant than the intrinsic base.

19. The method of claim 18, wherein forming the extrinsic base region further comprises:
forming a dummy gate over the intrinsic base;
forming spacer structures at side surfaces of the dummy gate;
removing the dummy gate, leaving behind the spacer structures; and
forming the extrinsic base region between the spacer structures and above the intrinsic base.

20. The method of claim 19, further comprising:
forming an emitter extension adjacent to the emitter, between the emitter and the collector; and
doping the emitter extension to a third concentration of the first dopant, wherein the third concentration is similar to the first concentration.

\* \* \* \* \*